(12) United States Patent
Collier-Hallman

(10) Patent No.: US 6,452,405 B1
(45) Date of Patent: Sep. 17, 2002

(54) METHOD AND APPARATUS FOR CALIBRATING A CURRENT SENSING SYSTEM

(75) Inventor: Steven James Collier-Hallman, Frankenmuth, MI (US)

(73) Assignee: Delphi Technologies, Inc., Troy, MI (US)

( * ) Notice: Subject to any disclaimer, the term of this patent is extended or adjusted under 35 U.S.C. 154(b) by 47 days.

(21) Appl. No.: 09/663,846

(22) Filed: Sep. 18, 2000

Related U.S. Application Data

(60) Provisional application No. 60/154,558, filed on Sep. 17, 1999.

(51) Int. Cl.⁷ ............................................. G01R 27/08
(52) U.S. Cl. ................... 324/713; 324/704; 324/705; 324/706
(58) Field of Search ................... 324/713, 704, 324/706, 63, 663, 705

(56) References Cited

U.S. PATENT DOCUMENTS

| | | | | |
|---|---|---|---|---|
| 3,676,686 A | * | 7/1972 | Allington | 250/206 |
| 3,784,905 A | * | 1/1974 | Blackwell | 324/663 |
| 4,041,382 A | * | 8/1977 | Washburn | 324/65 R |
| 4,841,229 A | * | 6/1989 | Eccleston | 324/63 |
| 4,922,169 A | * | 5/1990 | Freeman | 318/254 |
| 5,122,756 A | * | 6/1992 | Nelson | 324/706 |
| 5,371,469 A | | 12/1994 | Anderson | 324/705 |
| 5,450,015 A | * | 9/1995 | Mastico et al. | 324/665 |
| 5,469,071 A | * | 11/1995 | Obata | 324/713 |
| 5,627,476 A | * | 5/1997 | Chambers | 324/704 |
| 5,789,934 A | * | 8/1998 | Kolkowski et al. | 324/771 |
| 5,900,736 A | * | 5/1999 | Sovik et al. | 324/663 |
| 5,912,617 A | | 6/1999 | Poletto et al. | 340/450.2 |
| 5,939,991 A | * | 8/1999 | Deng | 340/638 |

* cited by examiner

*Primary Examiner*—N. Le
*Assistant Examiner*—Wasseem H. Hamdan
(74) *Attorney, Agent, or Firm*—Edmund P. Anderson

(57) ABSTRACT

Disclosed is a current sensing system for measuring the current flowing through a current sensing resistance. The system has a calibration resistance coupled to the current sensing resistance and a pair of input resistances each having a first end coupled to one of the ends of the current sensing resistance and a second end coupled to one of the ends of the calibration resistance. A voltage is created across the calibration resistance and the calibration resistance is set at a predetermined level to compensate for the current sensing resistance deviating from a reference value. The voltage is filtered and amplified to produce an output representative of the measured current.

17 Claims, 6 Drawing Sheets

METHOD AND APPARATUS FOR CALIBRATING A CURRENT SENSING SYSTEM

CROSS REFERENCE TO RELATED APPLICATIONS

This application claims the benefit of U.S. provisional patent application serial No. 60/154,558 filed Sep. 17, 1999, the disclosure of which is incorporated by reference herein in its entirety.

TECHNICAL FIELD

This disclosure relates to a current sensing system calibration method and apparatus, and more particularly, to a current sensing system calibration method and apparatus for a current sensing system that is used for controlling a motor.

BACKGROUND OF THE INVENTION

Current sensors are known in the art for monitoring current signals. FIG. 1 depicts a conventional current sensing system generally denoted by the numeral 10. An input current 12 flows through a current sensing resistance 14, such as a shunt resistance of a motor wiring. A first end 16 of a pair of input resistances 18 is connected to both ends of the current sensing resistance 14. Input resistances 18 may be used to control the input impedance of the current sensing system 10. Each of the input resistances 18 has a second end 20 connected to a filter 22. The current 12 through current sensing resistance 14 establishes a voltage 24 at filter 22. The filter 22 has a pair of output leads 26 connected to an amplifier 28. The amplifier 28 generates an output 30 indicative of the current 12.

The current sensing resistance 14 needs to have a reference value so that the voltage 24 input at filter 22 accurately reflects the current 12. Variations in the current sensing resistance 14 from a reference value will cause variations in the voltage 24 thus producing inaccurate current measurements. Several techniques have been proposed to calibrate the current sensing system 10 to accommodate the value of the current sensing resistance 14.

One calibration technique is to change gain resistors in amplifier 28. Changing gain resistance in the amplifier, however, may not be practical in certain situations. For example, the gain resistor may be internal to an integrated circuit (IC). The addition of further gain resistors external to the IC would affect gain accuracy and common mode rejection due to variability of the on-chip resistances over build and temperature.

Another technique for calibration of the current sensing system 10 involves changing or trimming the current sensing resistance 14 to alter its resistive value. Trimming can be difficult because of the high power involved (80 Amps, 2 milliohms). For example, in a situation wherein a blade shunt is used as the current sensing resistance 14, trimming would most likely damage the current sensing resistance. Resistors such as thick film shunt resistance are expensive and tend to be unsuitable for trimming.

Yet another technique for calibrating the current sensing system 10 is to use software to adjust the signal generated by amplifier 28. One drawback to the software approach, among others, is that it hurts resolution.

SUMMARY OF THE INVENTION

Disclosed is a current sensing system comprising a current sensing resistance through which a current to be measured flows. The system further has a calibration resistance coupled to the current sensing resistance and a pair of input resistances each having a first end coupled to one of the ends of the current sensing resistance and a second end coupled to one of the ends of the calibration resistance. A voltage is created across the calibration resistance and the calibration resistance is set at a predetermined level to compensate for any deviation of the current sensing resistance from a reference value.

Also disclosed is a motor driving system that uses the current sensing system of the invention to measure a DC bus current.

Also disclosed is a method for calibrating the current sensing system.

DESCRIPTION OF THE PREFERRED EMBODIMENT

Figure 1:
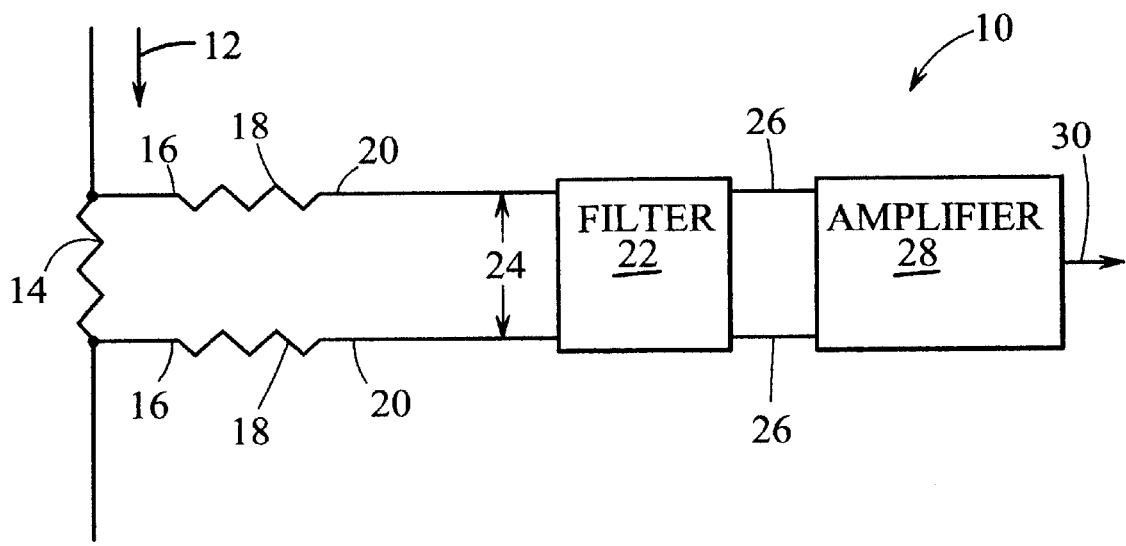
FIG. 1 is a prior art current sensing system.
Figure 2:
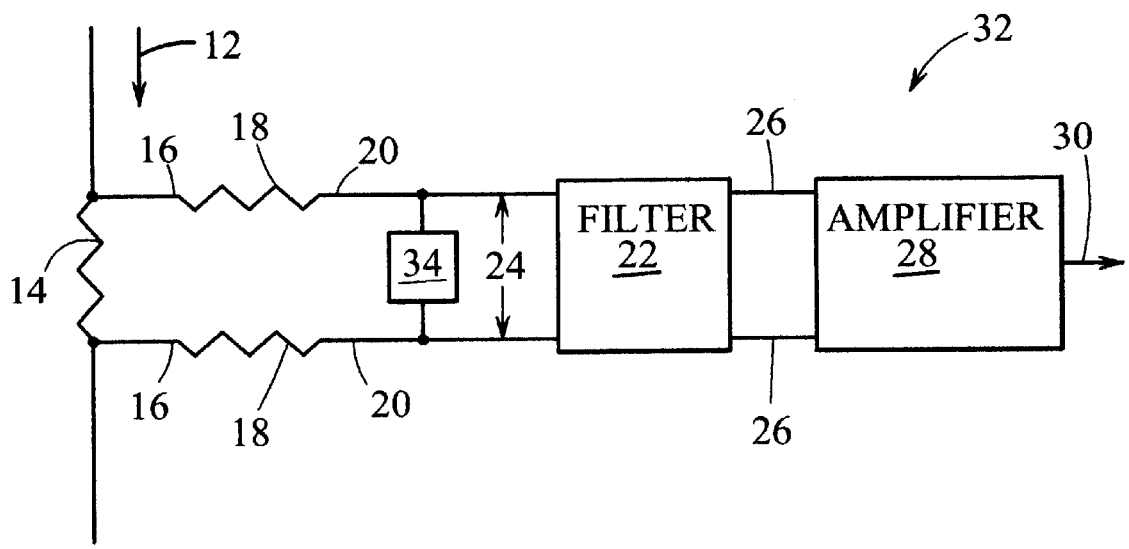
FIG. 2 is a current sensing system in one embodiment of the invention.

Referring to FIG. 2, reference numeral 32 generally designates a current sensing system in an exemplary embodiment of the invention. An input current 12 flows through a current sensing resistance 14, such as a shunt resistance of a motor wiring. A first end 16 of a pair of input resistances 18 is connected on both ends of current sensing resistance 14. Each of the input resistances 18 has a second end 20 connected to a calibration resistance 34, the structure of which is described herein. The calibration resistance 34 is connected in parallel to the input leads of filter 22. The filter 22 has an input voltage 24 corresponding to the voltage drop across the calibration resistance 34. The filter 22 has a pair of outputs leads 26 connected to an amplifier 28. The amplifier 28 generates an output signal on an output lead 30. As described in further detail herein, the resistive value of the calibration resistance 34 is selected and/or adjusted to compensate for variation in the current sensing resistance 14 from a reference value.

Figure 3:
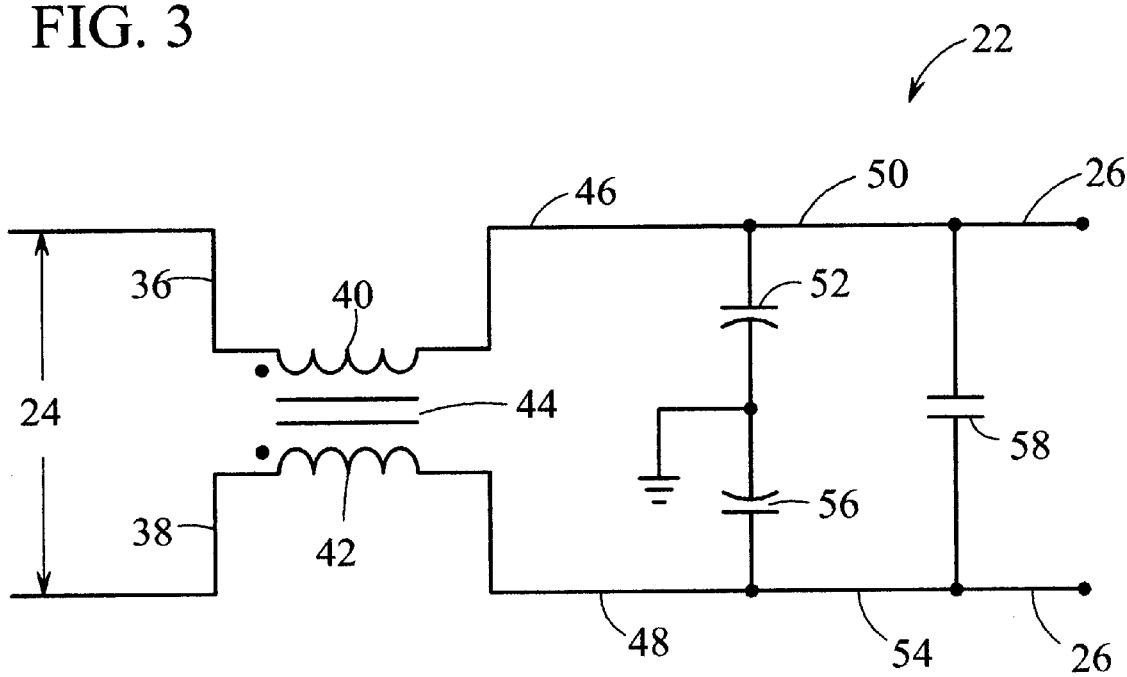
FIG. 3 is an exemplary filter.

Referring to FIG. 3, one embodiment of the filter 22 is shown. The input voltage 24 is applied to a pair of first ends 36, 38 of a pair of inductors 40, 42. The pair of inductors 40, 42 is magnetically coupled together by a coupling member 44 such as ferromagnetic material. The pair of inductors 40, 42 has a pair of second ends 46, 48 that are connected to a first end 50 of a first capacitance 52, and a first end 54 of a second capacitance 56 respectively. The first capacitance 52 and the second capacitance 56 each have a grounded second end. Furthermore, the first ends 50, 54 are connected to a first and a second end of a third capacitance 58. In addition, the first ends 50, 54 are connected to the two output leads 26 of the filter 22 as well.

Figure 4:
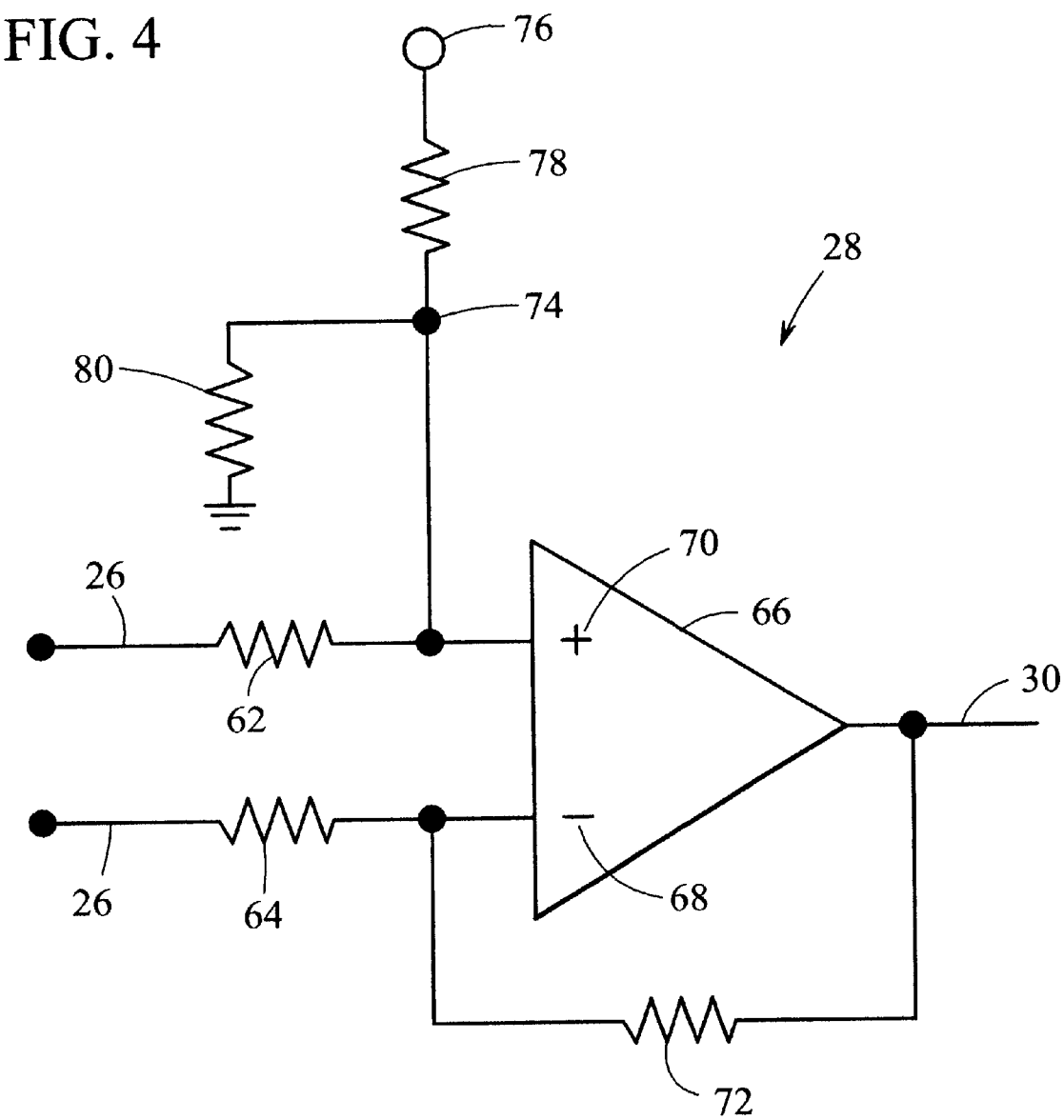
FIG. 4 is an exemplary amplifier.

Referring to FIG. 4, one embodiment of the amplifier 28 is shown. Two input resistances 62, 64 each have a first end connected to the output leads 26 of the filter 22. An operational amplifier that has an inverting input 68, a non-inverting input 70, and an output end that coincides with the output 30. The inverting input 68 is connected to a second end of the input resistance 64, as well as a first end of a feedback resistance 72 having its second end connected to the output 30 of the operational amplifier 66. The non-inverting end 70 is connected to a second end of the input resistance 62. In addition, the non-inverting end 70 is connected to a midpoint 74 of a voltage divider having a power source 76, an offset resistance 78, and a second resistance 80. The midpoint is connected to a first end of offset resistance 78, and a second resistance 80 respectively. The offset resistance 78 has a second end coupled to the power source 76. The second resistance 80 has a second end coupled to ground.

Figure 5A:
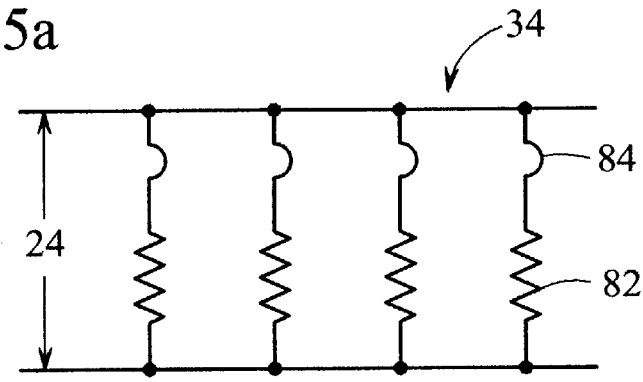
FIG. 5a, 5b, and 5c depict various embodiments for structure of the calibration resistance.
Figure 5B:
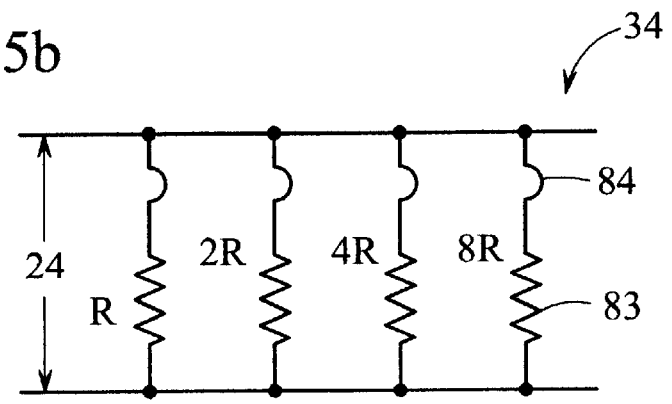
Figure 5C:
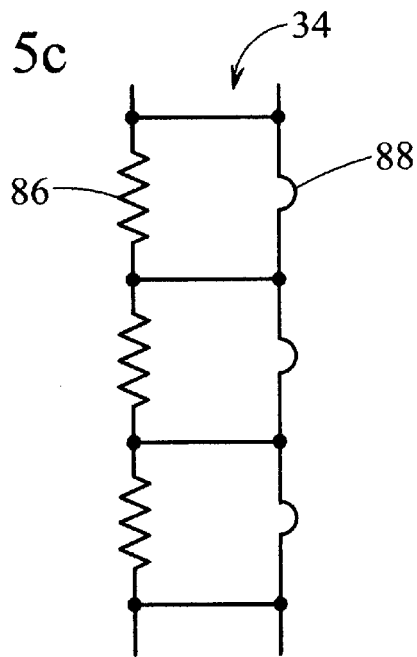

Referring to FIGS. 5a, 5b and 5c, embodiments of the calibration resistance 34 are shown. In FIG. 5a, the calibration resistance 34 includes a set of parallel resistances 82 (e.g., four resistances), with each resistance 82 having a switch 84 coupled in series with the resistance 82. The switches 84 may be activated using a number of techniques. Switches 84 may fusable links opened by passing current through the link or severable links that can be cut using known techniques such as laser, hydro cutting, etc. In this embodiment, the switches 84 are initially closed and then permanently opened. Alternatively, switches 84 may be initially open links which can be closed using known techniques (e.g., jumpers, DIP switches). In this embodiment, the switches 84 are initially open and then closed. In another embodiment, the switches 84 are controllable switches which can assume open or closed states in response to a controller. By closing or opening switches 84, the resistive value of the calibration resistance 34 can be adjusted in order to compensate for the current sensing resistance 14 deviating from a reference value.

In FIG. 5b, the set of parallel resistances 82 is assigned a sequence of values. In the instant case, the first parallel resistance is assigned a value of R, the second 2R, the third 4R, etc. The calibration resistance 34 includes N resistances, each resistance having a resistive value of $2^{N-1}R$. The value R is a predetermined resistive value, which is calculated based on a desired value of the calibration resistance 34. This embodiment allows the calibration resistance 34 to assume a resistive value of infinity (if no switches 84 are closed) to $2^{N-1}R/(2^N-1)$. As can be appreciated, by switchably connecting or disconnecting one or a combination of the switches 84, the calibration resistance 34 can be modified as necessary.

FIG. 5c depicts an alternative calibration resistance 34 which includes a set of series resistances 86. In the exemplary embodiment shown in FIG. 5c, only three resistances 86 are shown. Each resistance 86 has a switch 88 coupled in parallel with the resistance 86. The switches 88 can be opened or closed to reach a suitable calibration resistance 34 as described above with reference to FIG. 5a. The resistive values may be similar to those shown in FIG. 5b, that is the calibration resistance 34 includes N resistors, each resistor having a resistive value of $2^{N-1}R$. This embodiment allows the calibration resistance 34 to assume a resistive value of zero (if all switches 88 are closed) to $(2^N-1)R$.

Note that the embodiments depicted in FIGS. 5a, 5b, and 5c are far from exhaustive. Various combinations of FIGS. 5a, 5b, and 5c, may be used for the calibration resistance 34, even a single resistor if the resistance required can be predetermined in a specific application.

Figure 6A:
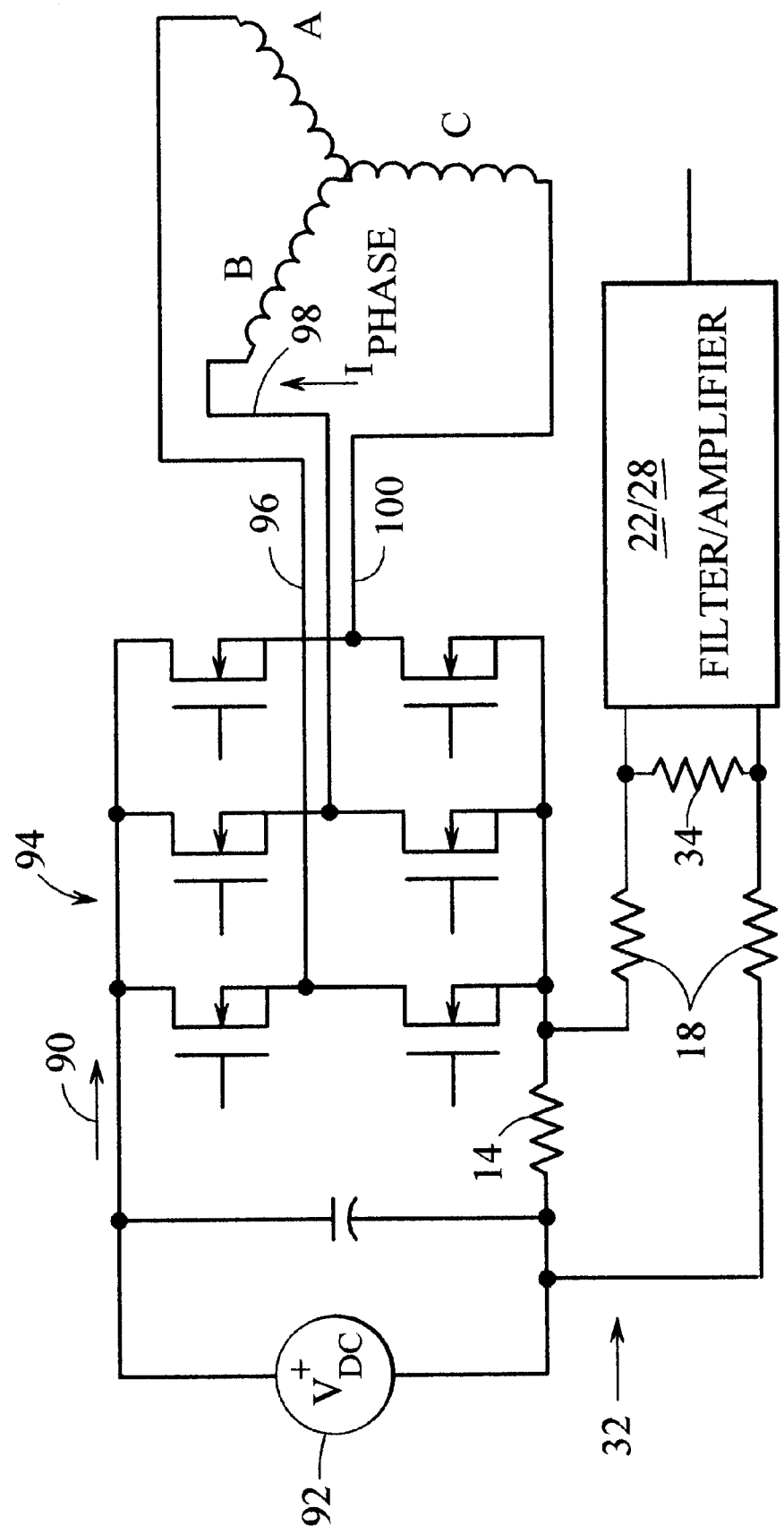
FIGS. 6a and 6b depict one of many applications for the instant invention.
Figure 6B:
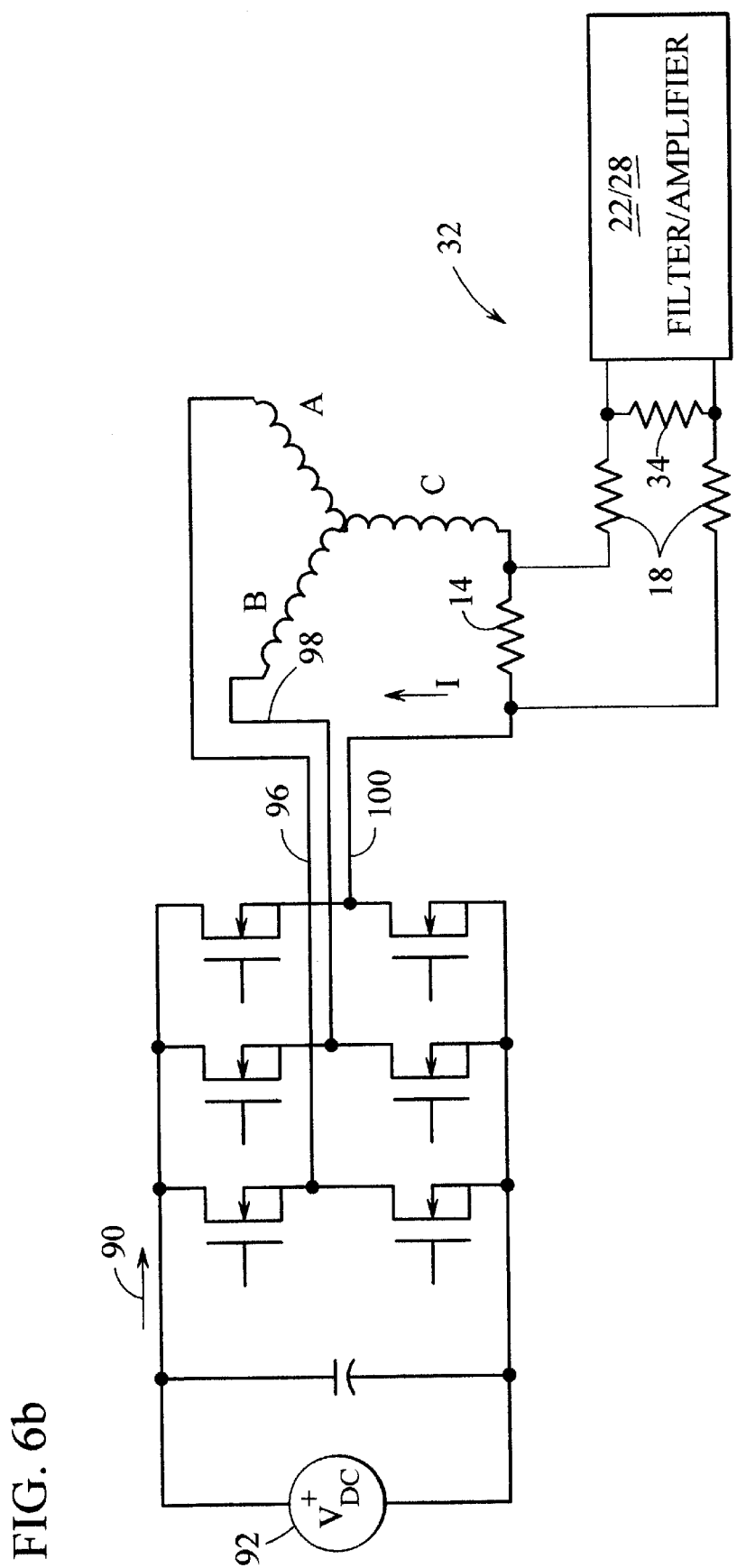

Referring to FIGS. 6a, and 6b, two of the applications of the invention, among many, are described. In FIG. 6a, the current sensing system 32 is used for sensing a direct current (DC) bus current 90 of an electric machine, such as an electric motor or generator and the like. A DC source 92 generates the DC bus current 90 that feeds a three phase inverter 94 having phases A, B, and C. The three-phase current is denoted by numerals 96, 98, and 100 and supplies a stator wiring of a PM brushless motor. The current sensing resistance 14 senses the DC bus current 90. The calibration resistance 34 in combination with resistances 18 calibrates the current signal for the filter/amplifier 22/28. FIG. 6b depicts an alternate embodiment in which the current sensing system 32 is used for sensing phase current 100.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What claimed is:

1. A current sensing system, comprising:
    a current sensing resistance, said current sensing resistance having a current to be measured flowing substantially therethrough;
    a calibration resistance coupled to said current sensing resistance;
    a pair of input resistances each having a first end coupled to one of the ends of said current sensing resistance, and each having a second end coupled to one of the ends of said calibration resistance; and
    a voltage existing across said calibration resistance, whereby said calibration resistance is set at a predetermined level to compensate for said current sensing resistance deviating from a reference value.

2. The current sensing system of claim 1, wherein:
    said calibration resistance comprises a set of parallel resistances, each resistance having a switch coupled in series thereto.

3. The current sensing system of claim 1, wherein said calibration resistance comprises a set of series resistances, each resistance having a switch coupled in parallel thereto.

4. The current sensing system of claim 2, wherein said set of parallel resistances includes N resistors, said N resistors having resistive values equal to $2^{N-1}R$, where R is a predetermined resistive value.

5. The current sensing system of claim 3, wherein said set of series resistances includes N resistors, said N resistors having resistive values equal to $2^{N-1}R$, where R is a predetermined resistive value.

6. The current sensing system of claim 1 wherein said current to be measured is a DC bus current of an electric machine.

7. The current sensing system of claim 1 wherein said current to be measured is a phase current of an electric machine.

8. A motor driving system, comprising:
    a DC bus having a DC bus current; and
    a current sensing system, comprising:
    a current sensing resistance, said current sensing resistance having a current flowing substantially therethrough;
    a calibration resistance coupled to said current sensing resistance;
    a pair of input resistances each having a first end coupled to one of the ends of said main current sensing resistance, and each having a second end coupled to one of the ends of said calibration resistance; and a voltage existing across said calibration resistance, whereby said calibration resistance is set at a predetermined level to compensate for said current sensing resistance deviating from a reference value.

9. The motor driving system of claim 8, wherein said calibration resistance comprises a set of parallel resistances, each resistance having a switch coupled in series thereto.

10. The motor driving system of claim 8, wherein said calibration resistance comprises a set of series resistances, each resistance having a switch coupled in parallel thereto.

11. The motor driving system of claim 9, wherein said set of parallel resistances includes N resistors, said N resistors having resistive values equal to $2^{N-1}R$, where R is a predetermined resistive value.

12. The motor driving system of claim 10, wherein said set of series resistances includes N resistors, said N resistors having resistive values equal to $2^{N-1}R$, where R is a predetermined resistive value.

13. The motor driving system of claim 8, further comprising a DC power source being coupled to said DC bus.

14. The motor driving system of claim 8, further comprising a multi-phased inverter having an input end being coupled to said DC bus.

15. A method for calibrating a current sensing system, comprising:

providing a current sensing resistance for sensing a current flowing substantially therethrough;

providing a calibration resistance coupled to said current sensing resistance;

providing a pair of input resistances each having a first end coupled to one of the ends of said main current sensing resistance, and each having a second end coupled to one of the ends of said calibration resistance; and adjusting said calibration resistance in response to a voltage over said calibration resistance.

16. The method of claim 15, wherein:

said calibration resistance comprises a set of parallel resistances, each resistance having a switch coupled in series thereto;

said adjusting includes at least one of opening and closing at least one switch.

17. The method of claim 15, wherein:

said calibration resistance comprises a set of series resistances, each resistance having a switch coupled in parallel thereto;

said adjusting includes one of opening and closing at least one switch.

* * * * *